(12) United States Patent
Wang et al.

(10) Patent No.: US 11,515,361 B2
(45) Date of Patent: Nov. 29, 2022

(54) LIGHT EMITTING DEVICE AND METHOD FOR MANUFACTURING THE SAME, AND DISPLAY DEVICE

(71) Applicant: BOE TECHNOLOGY GROUP CO., LTD., Beijing (CN)

(72) Inventors: Can Wang, Beijing (CN); Xiaochuan Chen, Beijing (CN); Minghua Xuan, Beijing (CN); Can Zhang, Beijing (CN); Angran Zhang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 16/825,922

(22) Filed: Mar. 20, 2020

(65) Prior Publication Data

US 2021/0134895 A1   May 6, 2021

(30) Foreign Application Priority Data

Nov. 6, 2019 (CN) .......................... 201911074589.9

(51) Int. Cl.
*H01L 27/32* (2006.01)
*H01L 27/15* (2006.01)
*H01L 51/52* (2006.01)

(52) U.S. Cl.
CPC ........ *H01L 27/3218* (2013.01); *H01L 27/156* (2013.01); *H01L 27/3209* (2013.01); *H01L 51/5265* (2013.01)

(58) Field of Classification Search
CPC ... H01L 51/5265; H01L 27/156; H01L 25/50; H01L 25/18; H01L 22/22; H01L 27/3218
See application file for complete search history.

(56) References Cited

U.S. PATENT DOCUMENTS

| | | | | |
|---|---|---|---|---|
| 2002/0153844 A1* | 10/2002 | Koyama | ............... | H01L 27/156 315/169.3 |
| 2009/0322215 A1* | 12/2009 | Sung | ................... | H01L 27/3211 313/504 |
| 2013/0140533 A1* | 6/2013 | Lee | ..................... | H01L 27/3218 257/40 |
| 2019/0296264 A1* | 9/2019 | Mathai | ................ | H01L 51/5088 |
| 2020/0006692 A1* | 1/2020 | Seok | ................... | H01L 51/5004 |
| 2020/0027932 A1* | 1/2020 | Choi | ..................... | H01L 27/322 |
| 2020/0144548 A1* | 5/2020 | Xia | ...................... | H01L 51/5044 |
| 2021/0050387 A1* | 2/2021 | Kim | .................... | H01L 27/3258 |

\* cited by examiner

*Primary Examiner* — Eric K Ashbahian
(74) *Attorney, Agent, or Firm* — The Webb Law Firm (57) ABSTRACT

The present disclosure provides a light emitting device and a method for manufacturing the same, and a display device. The light emitting device includes a plurality of light emitting units including a red light emitting unit, a green light emitting unit, and a blue light emitting unit, each light emitting unit including a micro-cavity structure. The light emitting device includes an anode structure, a cathode and a functional layer therebetween. The functional layer includes a light emitting layer including a red light emitting layer at least partially located in the red light emitting unit, an orthographic projection of the red light emitting layer on the backplane not overlapping with that of the blue light emitting unit on the backplane; a green light emitting layer at least partially located in the green light emitting unit; and a blue light emitting layer at least partially located in the blue light emitting unit.

11 Claims, 8 Drawing Sheets

LIGHT EMITTING DEVICE AND METHOD FOR MANUFACTURING THE SAME, AND DISPLAY DEVICE

CROSS-REFERENCE TO RELATED APPLICATION

This application claims priority to Chinese Patent Application No. 201911074589.9 filed on Nov. 6, 2019, the disclosure of which is hereby incorporated by reference in its entirety.

TECHNICAL FIELD

The present disclosure relates to a light emitting device, and a method manufacturing the same, and a display device.

BACKGROUND

OLED (Organic Light Emitting Diode) devices are widely applied in flexible display field and micro-display field with the advantages of fast response, spontaneous light emission and the like.

The micro-display is suitable for use in a helmet-mounted display, a stereoscopic display, a glass display and the like, and may obtain accurate image information in conjunction with mobile communication network, satellite positioning and the like.

SUMMARY

According to one aspect of the embodiments of the present disclosure, a light emitting device is provided. The light emitting device comprises a plurality of light emitting units on a backplane, wherein the plurality of light emitting units comprises a red light emitting unit, a green light emitting unit, and a blue light emitting unit, and each of the plurality of light emitting units comprises a micro-cavity structure; and wherein the light emitting device comprises an anode structure, a cathode, and a functional layer located between the anode structure and the cathode, wherein the functional layer comprises a light emitting layer comprising: a red light emitting layer at least partially located in the red light emitting unit, wherein an orthographic projection of the red light emitting layer on the backplane does not overlap with an orthographic projection of the blue light emitting unit on the backplane, a green light emitting layer at least partially located in the green light emitting unit, and a blue light emitting layer at least partially located in the blue light emitting unit.

In some embodiments, an orthographic projection of the blue light emitting layer on the backplane does not overlap with an orthographic projection of the red light emitting unit on the backplane.

In some embodiments, the orthographic projection of the blue light emitting layer on the backplane does not overlap with an orthographic projection of the green light emitting unit on the backplane.

In some embodiments, the red light emitting layer is partially located in the green light emitting unit; the green light emitting layer is partially located in the red light emitting unit; and the red light emitting layer is in contact with the green light emitting layer.

In some embodiments, the blue light emitting layer is partially located in the red light emitting unit and the green light emitting unit.

In some embodiments, the red light emitting layer is partially located in the green light emitting unit; the green light emitting layer is partially located in the red light emitting unit; and the red light emitting layer is in contact with the green light emitting layer.

In some embodiments, one of the red light emitting layer and the green light emitting layer is in contact with the blue light emitting layer.

In some embodiments, the functional layer further comprises: a charge generating layer partially located in the red light emitting unit and the green light emitting unit, and located between the blue light emitting layer and one of the red light emitting layer and the green light emitting layer.

In some embodiments, an area of the orthographic projection of the blue light emitting unit on the backplane is 40%-60% of an area of an orthographic projection of the plurality of light emitting units on the backplane.

In some embodiments, the area of the orthographic projection of the blue light emitting unit on the backplane is 50% of the area of the orthographic projection of the plurality of light emitting units on the backplane.

In some embodiments, the anode structure comprises: a first anode structure located in the red light emitting unit; a second anode structure located in the green light emitting unit; and a third anode structure located in the blue light emitting unit, wherein: thicknesses of the first anode structure, the second anode structure, and the third anode structure are different from each other, so that thicknesses of the micro-cavity structure in the red light emitting unit, the micro-cavity structure in the green light emitting unit, and the micro-cavity structure in the blue light emitting unit are different from each other.

In some embodiments, each of the first anode structure, the second anode structure, and the third anode structure comprises an anode material layer, and a reflective material layer located between the anode material layer and the backplane; and wherein the micro-cavity structure of any one of the plurality of light emitting units comprises a portion of the functional layer located in the any one of the plurality of light emitting units and the anode material layer in the any one of the plurality of light emitting units.

In some embodiments, thicknesses of the anode material layer in the first anode structure, the anode material layer in the second anode structure, and the anode material layer in the third anode structure are different from each other.

In some embodiments, each of the first anode structure, the second anode structure, and the third anode structure further comprises: an insulating material layer located between the anode material layer and the reflective material layer, wherein the reflective material layer is connected to the anode material layer through a via penetrating through the insulating material layer, and thicknesses of the insulating material layer in the first anode structure, the insulating material layer in the second anode structure, and the insulating material layer in the third anode structure are different from each other; and wherein the micro-cavity structure of the any one of the plurality of light emitting units further comprises the insulating material layer in the any one of the plurality of light emitting units.

In some embodiments, the functional layer further comprises: a first electron transport layer located between the light emitting layer and the cathode; a first electron injection layer located between the first electron transport layer and the cathode; a first hole transport layer located between the light emitting layer and the anode structure; and a first hole injection layer located between the first hole transport layer and the anode structure, wherein each of the first electron transport layer, the first electron injection layer, the first hole transport layer, and the first hole injection layer is partially located in each of the plurality of light emitting units.

According to another aspect of the embodiments of the present disclosure, a display device is provided. The display device comprises: a backplane; and a plurality of pixel units located on the backplane, wherein each of the plurality of pixel units comprises a light emitting device comprising a plurality of light emitting units on a backplane, wherein the plurality of light emitting units comprises a red light emitting unit, a green light emitting unit, and a blue light emitting unit, and each of the plurality of light emitting units comprises a micro-cavity structure, and wherein the light emitting device comprises an anode structure, a cathode, and a functional layer located between the anode structure and the cathode, wherein the functional layer comprises a light emitting layer comprising: a red light emitting layer at least partially located in the red light emitting unit, wherein an orthographic projection of the red light emitting layer on the backplane does not overlap with an orthographic projection of the blue light emitting unit on the backplane, a green light emitting layer at least partially located in the green light emitting unit, and a blue light emitting layer at least partially located in the blue light emitting unit.

According to a further aspect of the embodiments of the present disclosure, a method for manufacturing a light emitting device is provided, wherein the light emitting device comprises a plurality of light emitting units comprising a red light emitting unit, a green light emitting unit, and a blue light emitting unit, and each of the plurality of light emitting units comprises a micro-cavity structure; and the method comprises: forming an anode structure on a backplane; forming a functional layer on one side of the anode structure away from the backplane, comprising forming a light emitting layer, wherein forming the light emitting layer comprises: forming a red light emitting layer at least partially located in the red light emitting unit, wherein an orthographic projection of the red light emitting layer on the backplane does not overlap with an orthographic projection of the blue light emitting unit on the backplane, forming a green light emitting layer at least partially located in the green light emitting unit, and forming a blue light emitting layer at least partially located in the blue light emitting unit; and forming a cathode on one side of the functional layer away from the anode structure.

In some embodiments, the red light emitting layer, the green light emitting layer, and the blue light emitting layer are formed using a same mask.

In some embodiments, forming the light emitting layer comprises: forming the red light emitting layer by a first evaporation process using the same mask, wherein the red light emitting layer is partially located in the green light emitting unit; forming the green light emitting layer by a second evaporation process using the same mask, wherein the green light emitting layer is partially located in the red light emitting unit and in contact with the red light emitting layer; and forming the blue light emitting layer by a third evaporation process using the same mask, wherein an orthographic projection of the blue light emitting layer on the backplane does not overlap with an orthographic projection of the red light emitting unit on the backplane, and does not overlap with an orthographic projection of the green light emitting unit on the backplane.

In some embodiments, the green light emitting layer is formed after the red light emitting layer is formed; and the blue light emitting layer is formed after the green light emitting layer is formed.

Other features, aspects and advantages of the present disclosure will become apparent from the following detailed description of exemplary embodiments of the present disclosure in conjunction with the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure. The present disclosure may be more clearly understood from the following detailed description in conjunction with the accompanying drawings, in which:

FIGS. 6 to 12B are schematic views showing structures obtained at different stages of a method for manufacturing alight emitting device according to some embodiments of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In the related art, a micro-cavity structure may be used to improve the brightness and the color gamut of an OLED device. However, the inventors have noticed that in the OLED device, the light emitted from the red light emitting layer in the blue light emitting unit and the light emitted from the blue light emitting layer in the blue light emitting unit may interfere with each other, which affects the purity of the light emitted from the blue light emitting unit, thereby affecting the light emitting effect of the OLED device.

Figure 1:
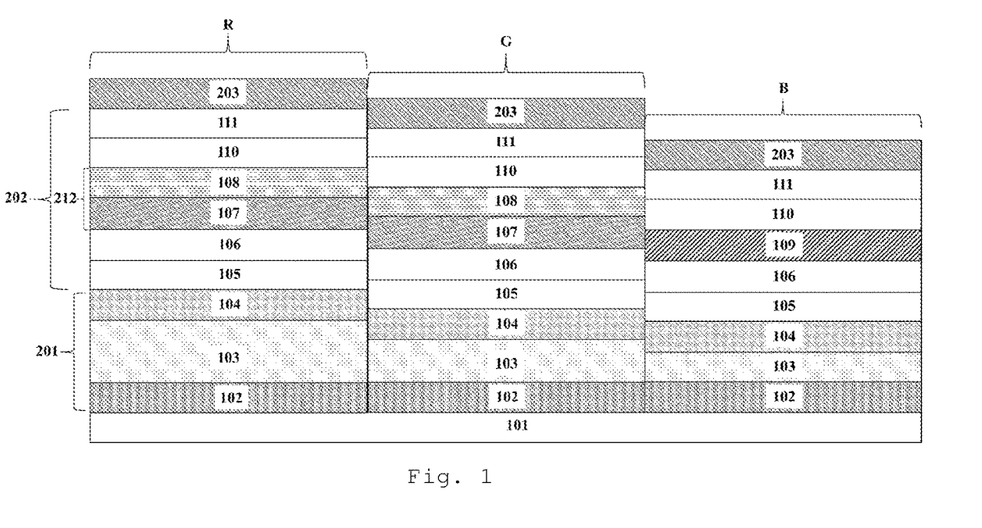
FIG. 1 is a schematic structural view showing a light emitting device according to an embodiment of the present disclosure.

FIG. 1 is a schematic structural view showing a light emitting device according to an embodiment of the present disclosure.

As shown in FIG. 1, the light emitting device comprises a plurality of light emitting units on the backplane 101, and each of the plurality of light emitting units comprises a micro-cavity structure. Here, the backplane 101 may comprise, for example, a silicon-based backplane. The plurality of light emitting units may comprise, for example, a red light emitting unit R, a green light emitting unit G, and a blue light emitting unit B.

It should be understood that the thickness (also referred to as an optical length) of the micro-cavity structure in each light emitting unit may be adjusted to interferometrically enhance a light at a specific wavelength, so that the red light emitting unit R may emit high-brightness red light, the green light emitting unit G may emit high-brightness green light, and the blue light emitting unit B may emit high-brightness blue light.

As shown in FIG. 1, the light emitting device comprises an anode structure 201, a cathode 203, and a functional layer 202 located between the anode structure 201 and the cathode 203. The material of the cathode 203 may comprise a semi-transmission and semi-reflection material, for example, magnesium silver alloy (MgAg), indium zinc oxide (IZO), and the like.

In some embodiments, the thickness of a portion of the anode structure 201 located in the red light emitting unit R, the thickness of a portion of the anode structure 201 located in the green light emitting unit G, and the thickness of a portion of the anode structure 201 located in the blue light emitting unit B are different from each other, so that the thickness of the micro-cavity structure in the red light emitting unit R, the thickness of the micro-cavity structure in the green light emitting unit G, and the thickness of the micro-cavity structure in the blue light emitting unit B are different from each other. For a distinguishing purpose, the portion of the anode structure 201 located in the red light emitting unit R, the portion of the anode structure 201 located in the green light emitting unit G, and the portion of the anode structure 201 located in the blue light emitting unit B are referred to as a first anode structure, a second anode structure, and a third anode structure respectively.

In some implementations, each of the first anode structure, the second anode structure, and the third anode structure may comprise an anode material layer 104 and a reflective material layer 102 between the anode material layer 104 and the backplane 101. The micro-cavity structure in each light emitting unit may be regarded as a portion of each light emitting unit located between the reflective material layer 102 and the cathode 202. In other words, the micro-cavity structure of any one of the plurality of light emitting units may comprise a portion of the functional layer 202 located in the any one of the plurality of light emitting units and the anode material layer 104 in the any one of the plurality of light emitting units. For example, the micro-cavity structure of the red light emitting unit R may comprise a portion of the functional layer 202 located in the red light emitting unit R and the anode material layer 104 in the red light emitting unit R. The green light emitting unit G and the blue light emitting unit B each has a similar micro-cavity structure to the micro-cavity structure of the red light emitting unit R. For example, the material of the anode material layer 104 may comprise indium tin oxide (ITO), Mo, or the like. For example, the material of the reflective material layer 102 may comprise a metal with a high reflection coefficient such as silver, aluminum, and the like.

In this case, the thickness of the anode material layer 104 in the first anode structure, the thickness of the anode material layer 104 in the second anode structure, and the thickness of the anode material layer 104 in the third anode structure are different from each other, so that different light emitting units have different thicknesses of micro-cavity structures.

In other implementations, each of the first anode structure, the second anode structure, and the third anode structure may further comprise an insulating material layer 103 located between the anode material layer 104 and the reflective material layer 102. The reflective material layer 102 may be connected to the anode material layer 104 through a via (not shown in FIG. 1) penetrating the insulating material layer 103. In this case, the micro-cavity structure of any one of the plurality of light emitting units may comprise a portion of the functional layer 202 located in the any one of the plurality of light emitting units, the insulating material layer 103 in the any one of the plurality of light emitting units, and the anode material layer 104 in the any one of the plurality of light emitting units. For example, the micro-cavity structure of the red light emitting unit R may comprise a portion of the functional layer 202 located in the red light emitting unit R, the insulating material layer 103 in the red light emitting unit R, and the anode material layer 104 in the red light emitting unit R. The green light emitting unit G and the blue light emitting unit B each has a similar micro-cavity structure to the micro-cavity structure of the red light emitting unit R. For example, the material of the insulating material layer 103 may comprise silicon nitride, silicon oxide, organic resin, and the like.

In this case, the thickness of the insulating material layers 103 in the first anode structure, the thickness of the insulating material layers 103 in the second anode structure, and the thickness of the insulating material layers 103 in the third anode structure are different from each other, so that different light emitting units have different thicknesses of micro-cavity structures.

As shown in FIG. 1, the functional layer 202 comprises a light emitting layer 212. The light emitting layer 212 comprises a red light emitting layer 107, a green light emitting layer 108, and a blue light emitting layer 109.

The red light emitting layer 107 is at least partially located in the red light emitting unit R. Here, the orthographic projection of the red light emitting layer 107 on the backplane 101 does not overlap with the orthographic projection of the blue light emitting unit B on the backplane 101. In other words, the blue light emitting unit B does not comprise the red light emitting layer 107. In some implementations, referring to FIG. 1, the red light emitting layer 107 may be partially located in the green light emitting unit G.

The green light emitting layer 108 is at least partially located in the green light emitting unit G. In some implementations, referring to FIG. 1, the green light emitting layer 108 may be partially located in the red light emitting unit R. In some embodiments, the red light emitting layer 107 may be in contact with the green light emitting layer 108.

The blue light emitting layer 109 is at least partially located in the blue light emitting unit B. For example, the blue light emitting layer 109 may be entirely located in the blue light emitting unit B.

The phase difference between a light emitted from a light emitting layer and a light reflected by the reflective material layer may be expressed as $\delta = 2j\,(\lambda/2) = 2nd\cos\theta$. Here, j is an integer, $\lambda$ is a wavelength of the light emitted from the light emitting layer in a light emitting unit, n is an average refractive index of various layers in the micro-cavity structure, d is a thickness of the micro-cavity structure, and $\theta$ is a reflection angle of the light emitted from the light emitting layer after incidence on the cathode. In a case where $\delta$ is an integer multiple of $2\pi$, the light emitted from the light emitting layer and the light reflected by the reflective material layer are interferometrically enhanced. It can be seen that, in order to obtain red light, green light, and blue light with higher brightness, the red light emitting unit R, the green light emitting unit G, and the blue light emitting unit B have different thicknesses of micro-cavity structures.

In some implementations, the functional layer 202 may further comprise a first hole injection layer 105, a first hole transport layer 106, a first electron transport layer 110, and a first electron injection layer 111, each of which is partially located in each light emitting unit. For example, the first hole transport layer 106 is located between the light emitting layer 212 and the anode structure 201, the first hole injection layer 105 is located between the first hole transport layer 106 and the anode structure 201, and the first electron transport layer 110 is located between the light emitting layer 212 and the cathode 203, and the first electron injection layer 111 is located between the first electron transport layer 110 and the cathode 203.

In the above embodiments, the orthographic projection of the red light emitting layer on the backplane does not overlap with that of the blue light emitting unit on the backplane. That is, the blue light emitting unit does not comprise the red light emitting layer. Therefore, the blue light emitted from the blue light emitting unit has higher purity, thereby improving the light emitting effect of the light emitting device.

In some embodiments, as shown in FIG. 1, the orthographic projection of the blue light emitting layer 109 on the backplane 101 does not overlap with that of the red light emitting unit R on the backplane 101. In other words, the red light emitting unit R does not comprise the blue light emitting layer 109. In such a structure, the red light emitted from the red light emitting unit R has a higher purity, thereby further improving the light emitting effect of the light emitting device.

In other embodiments, as shown in FIG. 1, the orthographic projection of the blue light emitting layer 109 on the backplane 101 does not overlap with that of the green light emitting unit G on the backplane 101. In other words, the green light emitting unit G does not comprise the blue light emitting layer 109. In such a structure, the green light emitted from the green light emitting unit G has a higher purity, thereby further improving the light emitting effect of the light emitting device.

In further embodiments, as shown in FIG. 1, the orthographic projection of the blue light emitting layer 109 on the backplane 101 does not overlap with that of the red light emitting unit R on the backplane 101, and does not overlap with that of the green light emitting unit G on the backplane 101. In other words, neither the red light emitting unit R nor the green light emitting unit G comprises the blue light emitting layer 109. In such a structure, the red light emitted from the red light emitting unit R has a higher purity, and the green light emitted from the green light emitting unit G has a higher purity, thereby still further improving the light emitting effect of the light emitting device.

It should be understood that the light emitted from the red light emitting layer 107 and the light emitted from the green light emitting layer 108 have little interference with each other. In order to facilitate implementing the process of the light emitting device, in some embodiments, the green light emitting unit G may further comprise a red light emitting layer 107, and the red light emitting unit R may further comprise a green light emitting layer 108, as shown in FIG. 1. For example, in the red light emitting unit R and the green light emitting unit G, the red light emitting layer 107 may be located below the green light emitting layer 108 and in contact with the green light emitting layer 108.

Figure 2:
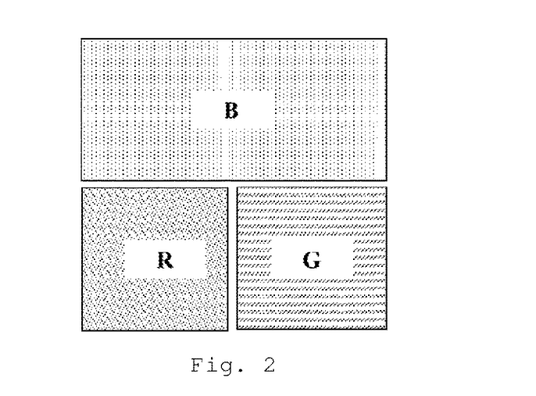
FIG. 2 is a schematic view showing an arrangement manner of a plurality of light emitting units in a light emitting device according to an embodiment of the present disclosure.

FIG. 2 is a schematic view showing an arrangement manner of a plurality of light emitting units in a light emitting device according to an embodiment of the present disclosure.

As shown in FIG. 2, the plurality of light emitting units comprises a red light emitting unit R, a green light emitting unit G, and a blue light emitting unit B. For example, the red light emitting unit R and the green light emitting unit G may be located in the same row different from the row where the blue light emitting unit B is located.

In some embodiments, in order to improve the service life of the light emitting device, the area of the orthographic projection of the blue light emitting unit B on the backplane 101 may be 40%-60% (e.g. 43%, 47%, 50%, 55%) of the area of the orthographic projection of the plurality of light emitting units on the backplane 101. In some embodiments, in order to further improve the service life of the light emitting device, the area of the orthographic projection of the red light emitting unit R on the backplane 101, the area of the orthographic projection of the green light emitting unit G on the backplane 101, and the area of the orthographic projection of the blue light emitting unit B on the backplane 101 may be 31%, 22%, and 47% of the area of the orthographic projections of all the light emitting units on the backplane 101 respectively.

It should be understood that the above percentages of 31%, 22%, and 47% may be obtained according to the luminous efficiency of the red light emitting layer, the green light emitting layer, and the blue light emitting layer, as well as the proportions of red light, green light, and blue light in white light. For example, the color coordinate of white light is (0.31, 0.31), the color coordinate of red light is (0.6696, 0.3302), the color coordinate of green light is (0.2494, 0.7058), and the color coordinate of blue light is (0.1391, 0.047). According to the color coordinates of white light, red light, green light, and blue light, the proportions of red light, green light, and blue light in white light can be obtained as 0.279731, 0.651882, and 0.068387 respectively. The ratio of the luminous efficiency of the red light emitting layer, the luminous efficiency of the green light emitting layer, and the luminous efficiency of the blue light emitting layer is around 6:20:1. In order to obtain the same service life, the area of the orthographic projection of the red light emitting unit R on the backplane 101, the area of the orthographic projection of the green light emitting unit G on the backplane 101, and the area of the orthographic projection of the blue light emitting unit B on the backplane 101 may be 31%, 22%, and 47% of the area of the orthographic projections of all the light emitting units in the light emitting device on the backplane 101 respectively.

Figure 3:
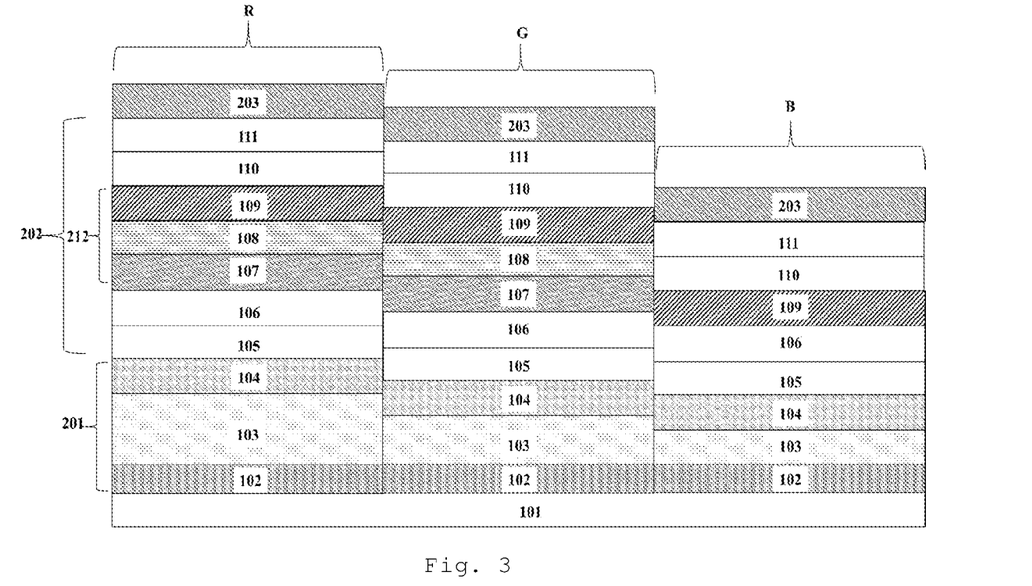
FIG. 3 is a schematic structural view showing a light emitting device according to another embodiment of the present disclosure.

FIG. 3 is a schematic structural view showing a light emitting device according to another embodiment of the present disclosure. In the following, only the differences between the light emitting device shown in FIG. 3 and the light emitting device shown in FIG. 1 will be mainly introduced. For the similarities, reference may be made to the above description.

In FIG. 1, the blue light emitting layer 109 is entirely located in the blue light emitting unit B. In FIG. 3, however, the blue light emitting layer 109 is partially located in the blue light emitting unit B.

As shown in FIG. 3, the blue light emitting layer 109 is partially located in the red light emitting unit R and the green light emitting unit G. In other words, the red light emitting unit R and the green light emitting unit G may each comprise a blue light emitting layer 109. In some embodiments, the green light emitting unit G may further comprise a red light emitting layer 107, and the red light emitting unit R may further comprise a green light emitting layer 108. For example, the red light emitting layer 107 may be in contact with the green light emitting layer 108.

In some implementations, the blue light emitting layer 109 may be located above the green light emitting layer 108 and in contact with the green light emitting layer 108. It should be understood that the embodiments of the present disclosure are not limited thereto. For example, in other implementations, the blue light emitting layer 109 may also be located below the red light emitting layer 107 and in contact with the red light emitting layer 107.

In the above embodiment, the blue light emitting layer is partially located in the red light emitting unit and the green light emitting unit, thereby facilitating implementing the process of the light emitting device.

Figure 4:
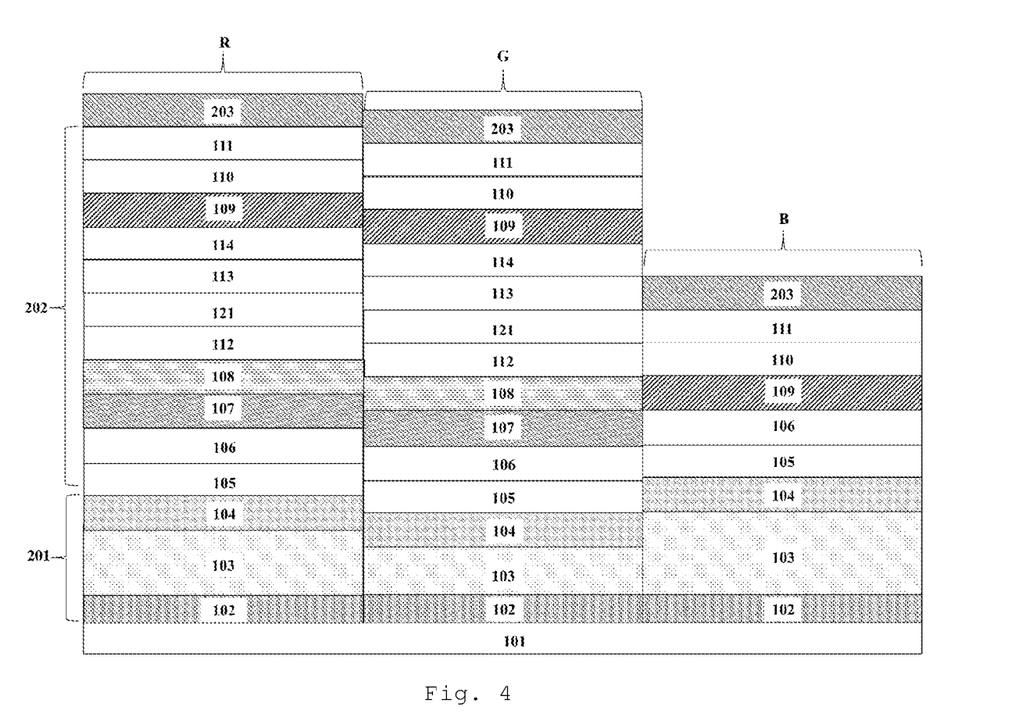
FIG. 4 is a schematic structural view showing a light emitting device according to a further embodiment of the present disclosure.

FIG. 4 is a schematic structural view showing a light emitting device according to a further embodiment of the present disclosure. In the following, only the differences between the light emitting device shown in FIG. 4 and the light emitting device shown in FIG. 3 will be mainly introduced. For the similarities, reference may be made to the above description.

Compared with the light emitting device shown in FIG. 3, the functional layer 202 in the light emitting device shown in FIG. 4 further comprises a charge generating layer 121. The charge generating layer 121 is partially located in the red light emitting unit R and the green light emitting unit G, and located between the blue light emitting layer 109 and one of the red light emitting layer 107 and the green light emitting layer 108. For example, the charge generating layer 121 may be located between the red light emitting layer 107 and the blue light emitting layer 109. For another example, the charge generating layer 121 may be located between the green light emitting layer 108 and the blue light emitting layer 109.

In some implementations, the functional layer 202 may further comprise a second electron transport layer 112, a second hole injection layer 113, and a second hole transport layer 114. For example, the second electron transport layer 112 is located between the green light emitting layer 108 and the charge generating layer 121, the second hole injection layer 113 is located between the charge generating layer 121 and the blue light emitting layer 109, and the second hole transport layer 114 is located between the second hole injection layer 113 and the blue light emitting layer 109.

It should be understood that the relative positions of the red light emitting layer 107 and the green light emitting layer 108 in the red light emitting unit R and the green light emitting unit G may be interchanged. It should also be understood that although the blue light emitting layer 109 shown in FIG. 4 is located above the red light emitting layer 107 and the green light emitting layer 108, this is not restrictive. In some embodiments, the blue light emitting layer 109 may also be located below the red light emitting layer 107 and the green light emitting layer 108.

The embodiments of the present disclosure also provide a display device. The display device comprises a backplane 101 and a plurality of pixel units located on the backplane 101, and each pixel unit may comprise the light emitting device of any one of the above embodiments. In some embodiments, the display device may be, for example, a display panel, a mobile terminal, a television, a display (e.g., a micro-display), a notebook computer, a digital photo frame, a navigator, an electronic paper, or any product or component having a display function.

Figure 5:
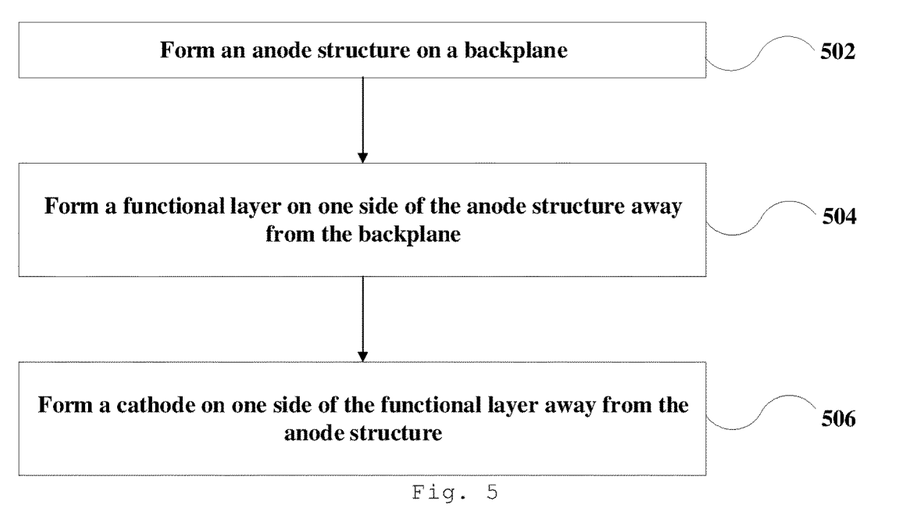
FIG. 5 is a schematic flowchart showing a method for manufacturing a light emitting device according to an embodiment of the present disclosure.

FIG. 5 is a schematic flowchart showing a method for manufacturing a light emitting device according to an embodiment of the present disclosure. FIGS. 6 to 12B are schematic views showing structures obtained at different stages of a method for manufacturing a light emitting device according to some embodiments of the present disclosure.

A method for manufacturing a light emitting device according to some embodiments of the present disclosure will be described below in conjunction with FIG. 5 and FIGS. 6 to 12B. Here, the light emitting device comprises a plurality of light emitting units, for example, a red light emitting unit R, a green light emitting unit G, and a blue light emitting unit B. Each light emitting unit comprises a microcavity structure.

At step 502, an anode structure 201 is formed on the backplane 101. The backplane 101 may comprise, for example, a silicon-based backplane.

Figure 6:
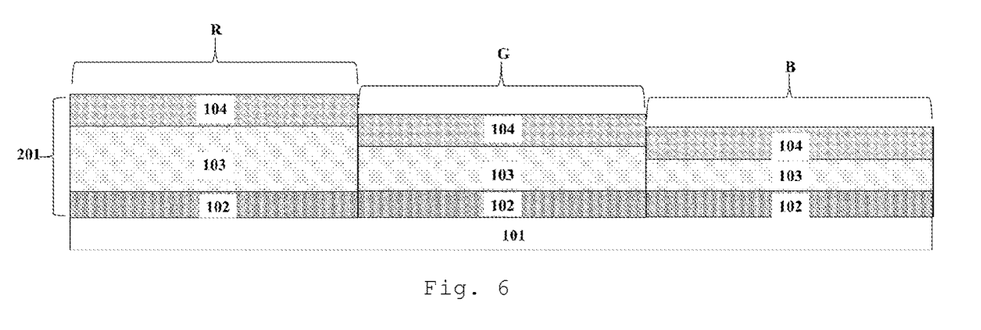

As shown in FIG. 6, for example, a reflective material layer 102 is formed first on the backplane 101, and then an anode material layer 104 is formed on the reflective material layer 102 to form the anode structure 201. Here, the thicknesses of the portions of the reflective material layer 102 located in different light emitting units may be the same as each other, and the thicknesses of the portions of the anode material layer 104 located in different light emitting units may be different from each other, so that different light emitting units have different thicknesses of micro-cavity structures.

For another example, after the reflective material layer 102 is formed, an insulating material layer 103 is formed first on the reflective material layer 102, and then form the anode material layer 104 is formed on the insulating material layer 103. Here, the thicknesses of the portions of the reflective material layer 102 located in different light emitting units may be the same as each other, the thicknesses of the portions of the anode material layer 104 located in different light emitting units may be the same as each other, and the thicknesses of the portions of the insulating material 103 in different light emitting units may be different from each other, so that different light emitting units have different thicknesses of micro-cavity structures.

At step 504, a functional layer 202 is formed on one side of the anode structure 201 away from the backplane 101.

Here, the functional layer 202 comprises a light emitting layer 212. Forming the light emitting layer 212 comprises forming a red light emitting layer 107, forming a green light emitting layer 108, and forming a blue light emitting layer 109.

Some implementations of forming the functional layer 202 will be introduced below in conjunction with FIGS. 7 to 9B.

Figure 7:
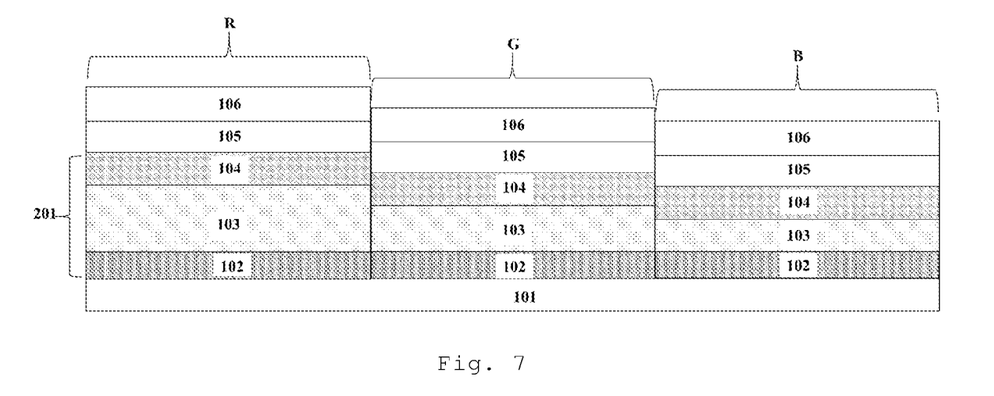

First, the first hole injection layer 105 and the first hole transport layer 106 may be formed first, as shown in FIG. 7. For example, the first hole injection layer 105 and the first hole transport layer 106 may be formed by an evaporation process using an open mask or a common mask. As some implementations, the open mask and the common mask may comprise a metal mask.

Figure 8:
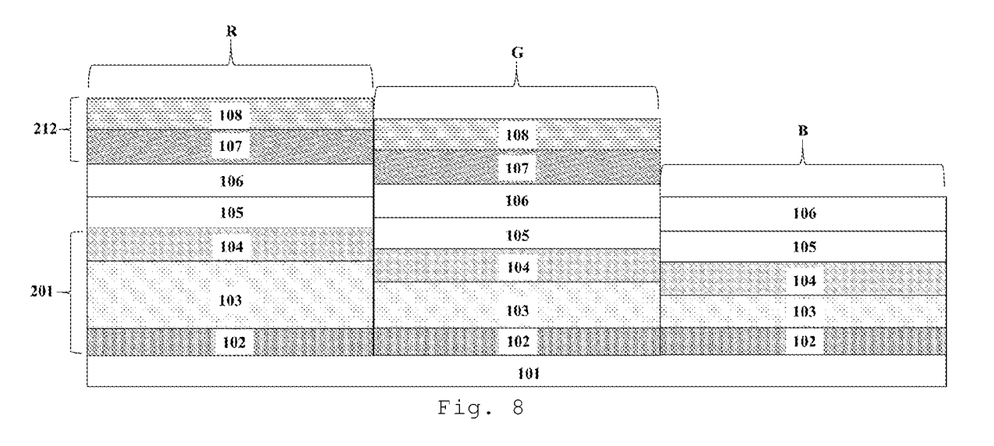
Figure 9A:
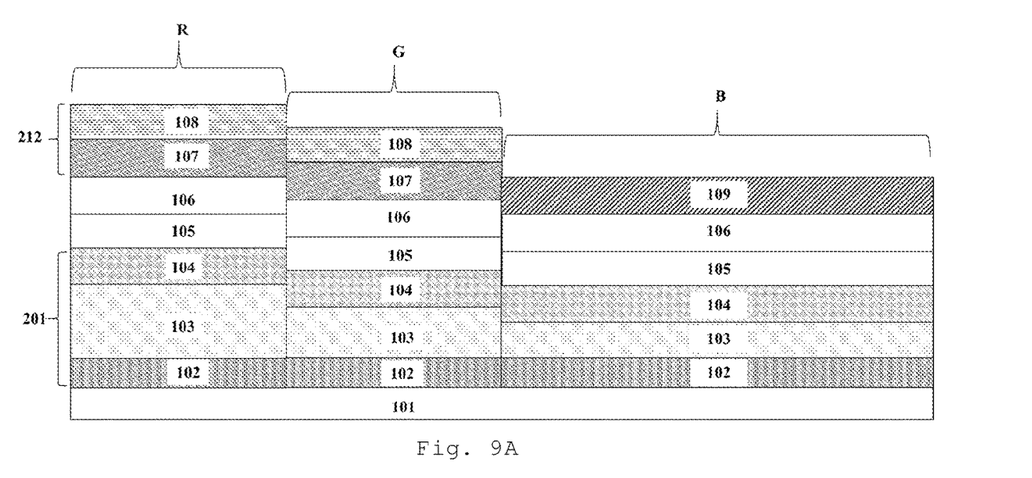
Figure 9B:
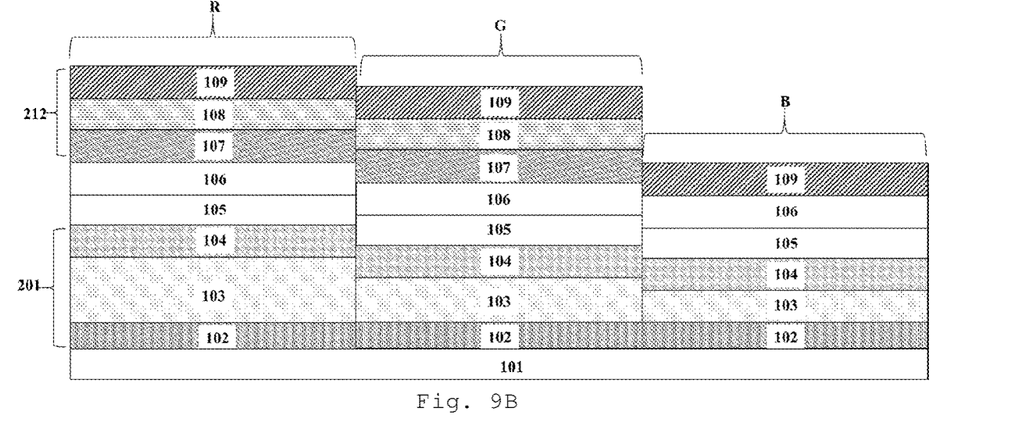

Next, a red light emitting layer 107, a green light emitting layer 108, and a blue light emitting layer 109 are formed, as shown in FIGS. 8, 9A, and 9B.

In some embodiments, the red light emitting layer 107, the green light emitting layer 108, and the blue light emitting layer 109 may be formed using the same mask, such as a Fine Metal Mask (FMM).

As shown in FIG. 8, the red light emitting layer 107 and the green light emitting layer 108 may be formed first. Here, the red light emitting layer 107 is at least partially located in the red light emitting unit R, and the green light emitting layer 108 is at least partially located in the green light emitting unit G. For example, the red light emitting layer 107 may be partially located in the red light emitting unit R and partially located in the green light emitting unit G. For example, the green light emitting layer 108 may be partially located in the green light emitting unit G and partially located in the red light emitting unit R.

In some implementations, the red light emitting layer 107 is formed by a first evaporation process using a mask, and then the green light emitting layer 108 is formed by a second evaporation process using this mask. In other implementations, the green light emitting layer 108 is formed first, and then the red light emitting layer 107 is formed.

FIG. 9A is a schematic view showing the formation of a blue light emitting layer 109 according to an implementation of the present disclosure.

As shown in FIG. 9A, the blue light emitting layer 109 is formed. Here, the orthographic projection of the blue light emitting layer 109 on the backplane 101 does not overlap with that of the red light emitting unit R on the backplane 101 and that of the green light emitting unit G on the backplane 101. That is, only the blue light emitting unit B comprises the blue light emitting layer 109.

For example, the blue light emitting layer 109 may be formed using the same mask as that used to form the green light emitting layer 108 and the red light emitting layer 107.

In some embodiments, the area of the orthographic projection of the blue light emitting unit B on the backplane 101 is half the area of the orthographic projection of the plurality of light emitting units on the backplane 101. In this case, after the green light emitting layer 108 is formed using a mask, the blue light emitting layer 109 may be formed only by moving this mask to a position so that the opening of this mask is located where the blue light emitting unit B is located. It can be seen that, in a case where the light emitting device is applied to a display device, the resolution of the mask is half that of the display device. Therefore, a display device with a higher resolution can be manufactured using an existing mask and can have improved brightness.

FIG. 9B is a schematic view showing the formation of a blue light emitting layer 109 according to another implementation of the present disclosure.

As shown in FIG. 9B, the blue light emitting layer 109 is formed. Here, the blue light emitting layer 109 is partially located in the red light emitting unit R and the green light emitting unit G. That is, the red light emitting unit R and the green light emitting unit G also comprise the blue light emitting layer 109.

For example, the red light emitting layer 107 and the green light emitting layer 108 may be formed by a first evaporation process and a second evaporation process using the same mask (e.g., a fine metal mask) respectively. Then, the blue light emitting layer 109 is formed by a third evaporation process using another mask (e.g., an open mask or a common mask).

In addition, before the blue light emitting layer 109 is formed, a charge generating layer may also be formed above the green light emitting layer 108. In some implementations, an electron transport layer between the charge generating layer and the green light emitting layer 108, as well as a hole transport layer and a hole injection layer both between the charge generating layer and the blue light emitting layer 109 may also be formed.

It should be noted that, although introduction is made above by taking the formation of the red light emitting layer 107 and the green light emitting layer 108 before the formation of the blue light emitting layer 109 as an example, this is not restrictive. For example, the blue light emitting layer 109 may also be formed first, and then the red light emitting layer 107 and the green light emitting layer 108 are formed.

Figure 10A:
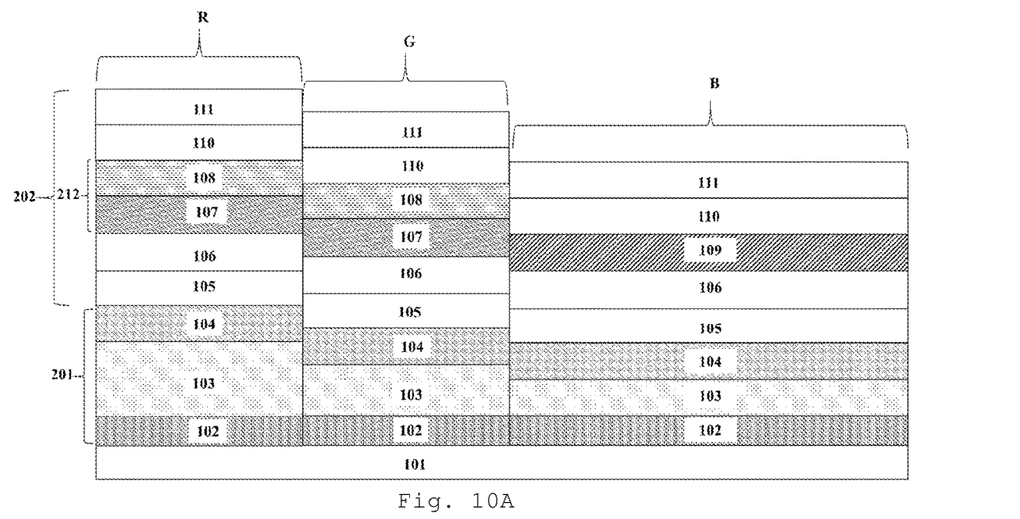
Figure 10B:
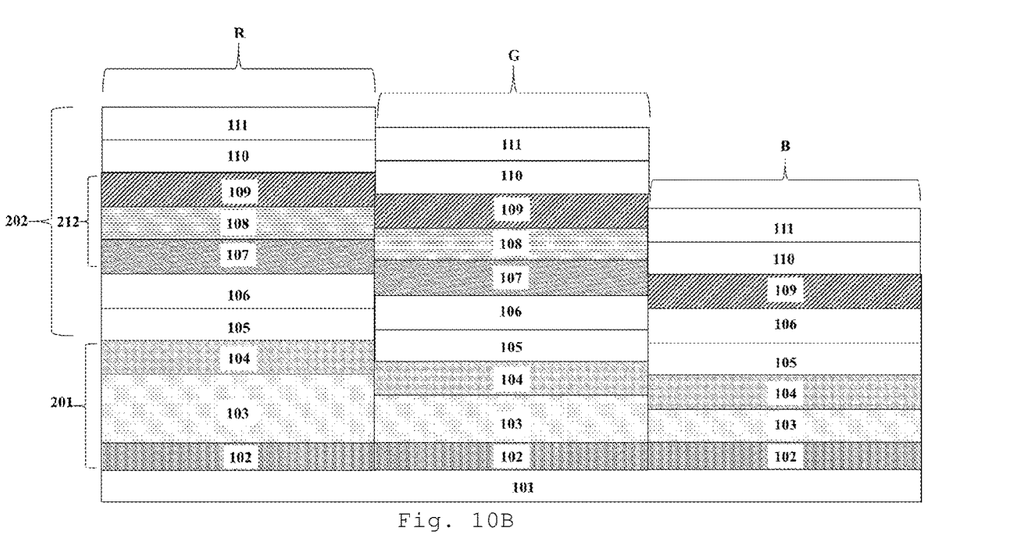

Next, a first electron transport layer 110 and a first electron injection layer 111 are formed, as shown in FIGS. 10A and 10B.

Here, the first electron transport layer 110 is located between the first electron injection layer 111 and the light emitting layer 212. The light emitting layer 212 comprises the red light emitting layer 107, the green light emitting layer 108, and the blue light emitting layer 109. For example, the first electron transport layer 110 and the first electron injection layer 111 may be formed by an evaporation process using an open mask or a common mask.

Figure 11A:
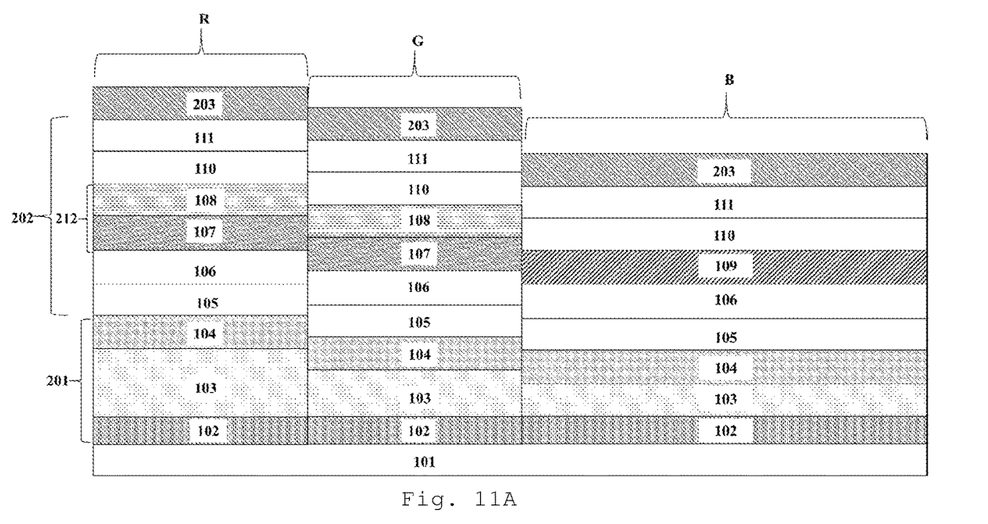
Figure 11B:
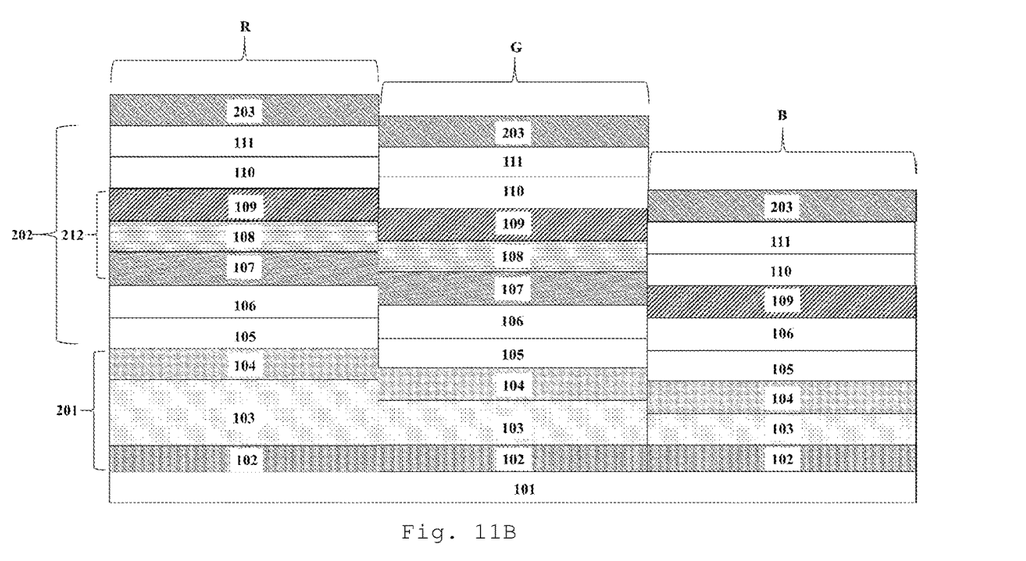

At step 506, a cathode 203 is formed on one side of the functional layer 202 away from the anode structure 201, as shown in FIGS. 11A and 11B.

For example, the cathode 203 may be formed by an evaporation process using an open mask or a common mask.

Figure 12A:
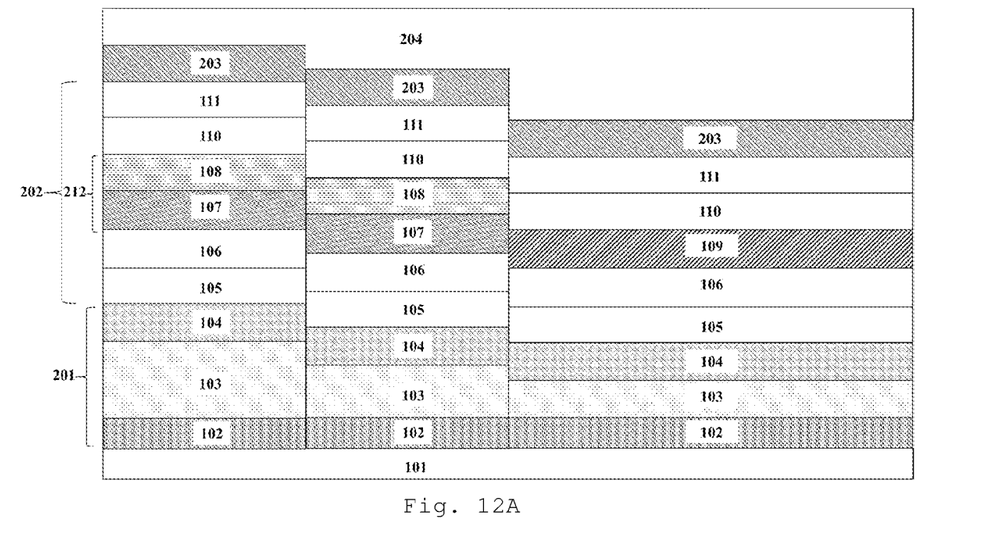
Figure 12B:
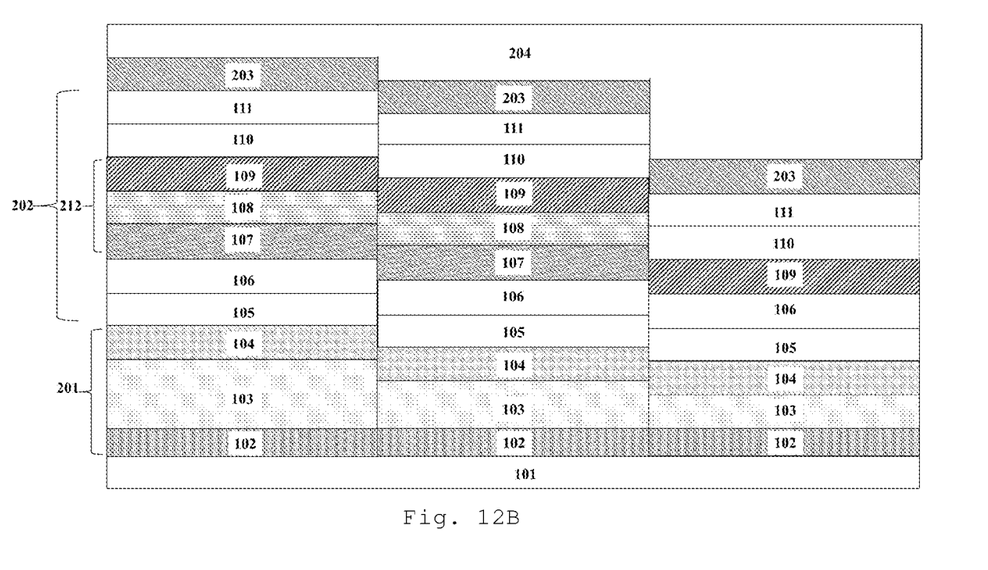

After that, an encapsulation layer 204 may also be formed on the cathode 203, as shown in FIGS. 12A and 12B.

In some implementations, the encapsulation layer 204 may comprise a thin film encapsulation layer. The thin film encapsulation layer may comprise, for example, two inorganic layers and an organic layer located between the two inorganic layers.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A light emitting device, comprising a plurality of light emitting units on a backplane, wherein the plurality of light emitting units comprises a red light emitting unit, a green light emitting unit, and a blue light emitting unit, and each of the plurality of light emitting units comprises a micro-cavity structure; and wherein the light emitting device comprises an anode structure, a cathode, and a functional layer located between the anode structure and the cathode, wherein the functional layer comprises a light emitting layer comprising:

a red light emitting layer at least partially located in the red light emitting unit, wherein an orthographic projection of the red light emitting layer on the backplane does not overlap with an orthographic projection of the blue light emitting unit on the backplane;

a green light emitting layer at least partially located in the green light emitting unit;

a blue light emitting layer partially located in the blue light emitting unit, and partially located in the red light emitting unit; and the green light emitting unit; and a charge generating layer partially located in the red light emitting unit and the green light emitting unit, and located between the blue light emitting layer and one of the red light emitting layer and the green light emitting layer, wherein the charge generating layer is not located in the blue light emitting unit;

wherein the anode structure comprises a first anode structure located in the red light emitting unit, a second anode structure located in the green light emitting unit, and a third anode structure located in the blue light emitting unit, wherein thicknesses of the first anode structure, the second anode structure, and the third anode structure are different from each other, so that thicknesses of the micro-cavity structure in the red light emitting unit, the micro-cavity structure in the green light emitting unit, and the micro-cavity structure in the blue light emitting unit are different from each other;

wherein each of the first anode structure, the second anode structure, and the third anode structure comprises an anode material layer, a reflective material layer located between the anode material layer and the backplane, and an insulating material layer located between the anode material layer and the reflective material layer, wherein the reflective material layer is connected to the anode material layer through a via penetrating through the insulating material layer, and thicknesses of the insulating material layer in the third anode structure, the insulating material layer in the first anode structure, and the insulating material layer in the second anode structure decrease in order; and wherein the micro-cavity structure of any one of the plurality of light emitting units comprises a portion of the functional layer located in the any one of the plurality of light emitting units, the anode material layer in the any one of the plurality of light emitting units and the insulating material layer in the any one of the plurality of light emitting units.

2. The light emitting device according to claim 1, wherein:

the red light emitting layer is partially located in the green light emitting unit;

the green light emitting layer is partially located in the red light emitting unit; and the red light emitting layer is in contact with the green light emitting layer.

3. The light emitting device according to claim 2, wherein one of the red light emitting layer and the green light emitting layer is in contact with the blue light emitting layer.

4. The light emitting device according to claim 1, wherein an area of the orthographic projection of the blue light emitting unit on the backplane is 40%-60% of an area of an orthographic projection of the plurality of light emitting units on the backplane.

5. The light emitting device according to claim 4, wherein the area of the orthographic projection of the blue light emitting unit on the backplane is 50% of the area of the orthographic projection of the plurality of light emitting units on the backplane.

6. The light emitting device according to claim 1, wherein the functional layer further comprises:

a first electron transport layer located between the light emitting layer and the cathode;

a first electron injection layer located between the first electron transport layer and the cathode;

a first hole transport layer located between the light emitting layer and the anode structure; and the first hole injection layer located between the first hole transport layer and the anode structure, wherein each of the first electron transport layer, the first electron injection layer, the first hole transport layer, and the first hole injection layer, layer is partially located in each of the plurality of light emitting units.

7. A display device, comprising:

a backplane; and a plurality of pixel units located on the backplane, wherein each of the plurality of pixel units comprises a light emitting device comprising a plurality of light emitting units on the backplane, wherein the plurality of light emitting units comprises a red light emitting unit, a green light emitting unit, and a blue light emitting unit, and each of the plurality of light emitting units comprises a micro-cavity structure, and wherein the light emitting device comprises an anode structure, a cathode, and a functional layer located between the anode structure and the cathode, wherein the functional layer comprises a light emitting layer comprising:

a red light emitting layer at least partially located in the red light emitting unit, wherein an orthographic projection of the red light emitting layer on the backplane does not overlap with an orthographic projection of the blue light emitting unit on the backplane;

a green light emitting layer at least partially located in the green light emitting unit;

a blue light emitting layer partially located in the blue light emitting unit, and partially located in the red emitting unit and the green light emitting unit, and a charge generating layer partially located in the red light emitting unit and the green light emitting unit, and located between the blue light emitting layer and one of the red light emitting layer and the green light emitting layer, wherein the charge generating layer is not located in the blue light emitting unit;

wherein the anode structure comprises a first anode structure located in the red light emitting unit, a second anode structure located in the green light emitting unit, and a third anode structure located in the blue light emitting unit, wherein thicknesses of the first anode structure, the second anode structure, and the third anode structure are different from each other, so that thicknesses of the micro-cavity structure in the red light emitting unit, the micro-cavity structure in the green light emitting unit, and the micro-cavity structure in the blue light emitting unit are different from each other;

wherein each of the first anode structure, the second anode structure, and the third anode structure comprises an anode material layer, a reflective material layer located between the anode material layer and the backplane, and an insulating material layer located between the anode material layer and the reflective material layer, wherein the reflective material layer is connected to the anode material layer through a via penetrating through the insulating material layer, and thicknesses of the insulating material layer in the third anode structure, the insulating material layer in the first anode structure, and the insulating material layer in the second anode structure decrease in order; and wherein the micro-cavity structure of any one of the plurality of light emitting units comprises a portion of the functional layer located in the any one of the plurality of light emitting units, the anode material layer in the any one of the plurality of light emitting units and the insulating material layer in the any one of the plurality of light emitting units.

8. A method for manufacturing a light emitting device, wherein the light emitting device comprises a plurality of light emitting units comprising a red light emitting unit, a green light emitting unit, and a blue light emitting unit, and each of the plurality of light emitting units comprises a micro-cavity structure; and the method comprises:

forming an anode structure on a backplane;

forming a functional layer on one side of the anode structure away from the backplane, comprising forming a light emitting layer, wherein forming the light emitting layer comprises:

forming a red light emitting layer at least partially located in the red light emitting unit, wherein an orthographic projection of the red light emitting layer on the backplane does not overlap with an orthographic projection of the blue light emitting unit on the backplane, forming a green light emitting layer at least partially located in the green light emitting unit, forming a blue light emitting layer partially located in the blue light emitting unit, and partially located in the red light emitting unit and the green light emitting unit, and forming a charge generating layer partially located in the red light emitting unit and the green light emitting unit, and located between the blue light emitting layer and one of the red light emitting layer and the green light emitting layer, wherein the charge generating layer is not located in the blue light emitting unit; and forming a cathode on one side of the functional layer away from the anode structure;

wherein the anode structure comprises a first anode structure located in the red light emitting unit, a second anode structure located in the blue light emitting unit, wherein thicknesses of the first anode structure, the second anode structure, and the third anode structure are different from each other, so that thicknesses of the micro-cavity structure in the red light emitting unit, the micro-cavity structure in the green light emitting unit, and the micro-cavity structure in the blue light emitting unit are different from each other;

wherein each of the first anode structure, the second anode structure, and the third anode structure comprises an anode material layer, a reflective material layer located between the anode material layer and the backplane, and an insulating material layer located between the anode material layer and the reflective material layer, wherein the reflective material layer is connected to the anode material layer through a via penetrating through the insulating material layer, and thicknesses of the insulating material layer in the third anode structure, the insulating material layer in the first anode structure, and the insulating material layer in the second anode structure decrease in order; and wherein the micro-cavity structure of any one of the plurality of light emitting units comprises a portion of the functional layer located in the any one of the plurality of light emitting units, the anode material layer in the any one of the plurality of light emitting units and the insulating material layer in the any one of the plurality of light emitting units.

9. The method according to claim 8, wherein the red light emitting layer, the green light emitting layer, and the blue light emitting layer are formed using a same mask.

10. The method according to claim 9, wherein forming the light emitting layer comprises:

forming the red light emitting layer by a first evaporation process using the same mask, wherein the red light emitting layer is partially located in the green light emitting unit;

forming the green light emitting layer by a second evaporation process using the same mask, wherein the green light emitting layer is partially located in the red light emitting unit and in contact with the red light emitting layer; and forming the blue light emitting layer by a third evaporation process using the same mask, wherein an orthographic projection of the blue light emitting layer on the backplane does not overlap with an orthographic projection of the red light emitting unit on the backplane, and does not overlap with an orthographic projection of the green light emitting unit on the backplane.

11. The method according to claim 10, wherein:

the green light emitting layer is formed after the red light emitting layer is formed; and the blue light emitting layer is formed after the green light emitting layer is formed.

* * * * *

UNITED STATES PATENT AND TRADEMARK OFFICE
CERTIFICATE OF CORRECTION

| | | |
|---|---|---|
| PATENT NO. | : 11,515,361 B2 | Page 1 of 1 |
| APPLICATION NO. | : 16/825922 | |
| DATED | : November 29, 2022 | |
| INVENTOR(S) | : Can Wang et al. | |

It is certified that error appears in the above-identified patent and that said Letters Patent is hereby corrected as shown below:

In the Claims

Column 14, Line 49, Claim 6, after "injection" delete "layer,"

Column 16, Line 14, Claim 8, delete "blue" and insert -- green --

Column 16, Line 14, Claim 8, after "unit," insert -- and a third anode structure located in the blue light emitting unit, --

Signed and Sealed this
Seventeenth Day of January, 2023

*Katherine Kelly Vidal*

Katherine Kelly Vidal
*Director of the United States Patent and Trademark Office*